(12) United States Patent
Chae

(10) Patent No.: US 9,299,413 B1
(45) Date of Patent: Mar. 29, 2016

(54) SEMICONDUCTOR SYSTEMS

(71) Applicant: SK hynix Inc., Icheon-si Gyeonggi-do (KR)

(72) Inventor: Haeng Seon Chae, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/698,263

(22) Filed: Apr. 28, 2015

(30) Foreign Application Priority Data

Dec. 23, 2014 (KR) ........................ 10-2014-0187491

(51) Int. Cl.
*G11C 7/00* (2006.01)
*G11C 11/406* (2006.01)
*G11C 11/409* (2006.01)

(52) U.S. Cl.
CPC ........ *G11C 11/40611* (2013.01); *G11C 11/406* (2013.01); *G11C 11/409* (2013.01); *G11C 11/40615* (2013.01)

(58) Field of Classification Search
CPC ........... G11C 11/406; G11C 11/40615; G11C 11/40618; G11C 11/40611; G11C 11/4065
USPC ............ 365/222, 203, 233.1, 233.14, 230.03, 365/230.06, 230.08, 236
See application file for complete search history.

(56) References Cited

U.S. PATENT DOCUMENTS

| 6,256,230 | B1 * | 7/2001 | Miwa ..................... G11C 16/10 365/185.24 |
| 6,584,032 | B2 * | 6/2003 | Fujioka ................. G06F 1/3203 365/227 |
| 6,636,449 | B2 * | 10/2003 | Matsuzaki ........... G11C 11/406 365/222 |
| 7,495,986 | B2 * | 2/2009 | Fujioka ................. G06F 1/3203 365/222 |
| 8,358,554 | B2 * | 1/2013 | Kim ..................... G11C 11/406 365/149 |
| 8,498,167 | B1 * | 7/2013 | Huang ............. G11C 11/40615 365/189.07 |
| 2014/0152346 | A1 | 6/2014 | Nakajima |

FOREIGN PATENT DOCUMENTS

KR    1020060009580 A    2/2006

* cited by examiner

*Primary Examiner* — Gene Auduong
(74) *Attorney, Agent, or Firm* — William Park & Associates Ltd.

(57) ABSTRACT

A semiconductor system includes a controller and a semiconductor device. The controller outputs an external command signal. The semiconductor device compares the external command signal with a reference voltage signal to generate a refresh signal. The semiconductor device executes a refresh operation according to the refresh signal. The refresh signal is enabled if the reference voltage signal is not generated.

25 Claims, 3 Drawing Sheets

SEMICONDUCTOR SYSTEMS

CROSS-REFERENCE TO RELATED APPLICATION

The present application claims priority under 35 U.S.C 119(a) to Korean Application No. 10-2014-0187491, filed on Dec. 23, 2014, in the Korean Intellectual Property Office, which is incorporated herein by reference in its entirety as set forth in full.

BACKGROUND

1. Technical Field

Embodiments of the invention relate to semiconductor systems.

2. Related Art

Each of semiconductor devices may include an input buffer circuit that receives external signals which are supplied from an external device or an external system. The input buffer circuit may also amplify the external signals to change levels of the external signals into appropriate levels (e.g., CMOS levels) which can be processed by internal circuits of the semiconductor device.

A differential amplifier circuit utilizing a current mirror scheme may be widely used as the input buffer circuit. The differential amplifier circuit may be an amplifier circuit whose output signal is directly proportional to the instantaneous differences between two input signals thereof. That is, the differential amplifier circuit may instantaneously sense and amplify a small voltage difference between the two input signals thereof to output the amplified signal. Thus, the differential amplifier circuit may be employed in fast semiconductor devices that operate at high frequency. In general, the two input signals of the differential amplifier circuit may be signals having two opposite polarities, or one of the two input signals of the differential amplifier circuit may correspond to a reference signal and the other one of the two input signals of the differential amplifier circuit may correspond to an input signal.

SUMMARY

According to an embodiment, a semiconductor system includes a controller and a semiconductor device. The controller outputs an external command signal. The semiconductor device compares the external command signal with a reference voltage signal to generate a refresh signal. The semiconductor device executes a refresh operation according to the refresh signal. The refresh signal is enabled if the reference voltage signal is not generated.

According to an embodiment, a semiconductor device includes a reference voltage generator, an input buffer and a memory unit. The reference voltage generator generates a reference voltage signal with a constant level. The input buffer compares an external command signal with the reference voltage signal to generate a refresh signal. The input buffer drives the refresh signal with a drivability controlled according to a level of the reference voltage signal. The memory unit executes a refresh operation according to the refresh signal.

According to an embodiment, an input buffer includes a comparator and a pull-up driver. The comparator compares an external command signal with a reference voltage signal and drives an output node according to a comparison result of the external command signal and the reference voltage signal to generate a refresh signal through the output node. The pull-up driver pulls up the output node with a first drivability or a second drivability according to a level of the reference voltage signal.

DETAILED DESCRIPTION

Embodiments of the invention will be described hereinafter with reference to the accompanying figures. However, the embodiments described herein are for illustrative purposes only and are not intended to limit the scope of the invention. Various embodiments are directed to input buffers, semiconductor devices including the input buffers, and semiconductor systems including the input buffers.

Figure 1:
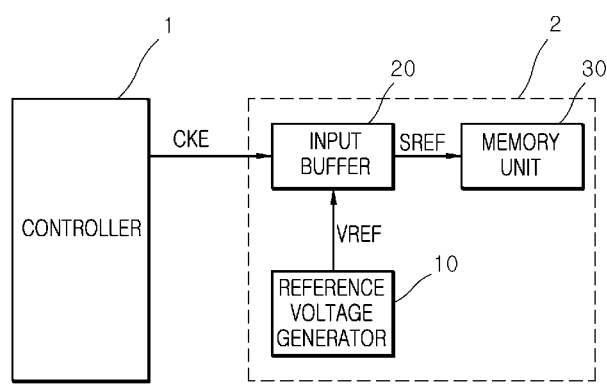
FIG. 1 is a block diagram illustrating a semiconductor system according to an embodiment.

Referring to FIG. 1, a block diagram illustrating a semiconductor system according to an embodiment is shown.

As illustrated in FIG. 1, a semiconductor system according to an embodiment may include a controller 1 and a semiconductor device 2.

The controller 1 may output an external command signal CKE. The controller 1 may be configured to control operations of the semiconductor device 2. The external command signal CKE may be a command signal to receive a clock signal used in operations of the semiconductor device 2 executed in synchronization with the clock signal. If the external command signal CKE is disabled, the semiconductor device 2 may enter an idle state during which a refresh operation is performed without execution of read/write operations.

The semiconductor device 2 may include a reference voltage generator 10, an input buffer 20 and a memory unit 30.

The reference voltage generator 10 may generate a reference voltage signal VREF having a certain constant voltage level regardless of variation of process/voltage/temperature (PVT) conditions. The reference voltage generator 10 may be realized not to generate the reference voltage signal VREF during the refresh operation. The reference voltage generator 10 may be realized using a Widlar circuit or a band gap voltage generation circuit.

The input buffer 20 may compare the external command signal CKE with the reference voltage signal VREF to generate a refresh signal SREF. A drivability of the input buffer 20 for generating the refresh signal SREF may be controlled according to a level of the reference voltage signal VREF. The refresh signal SREF may be enabled if the reference voltage signal VREF is not generated. Further, the refresh signal may be enabled if a level of the external command signal CKE is lower than a level of the reference voltage signal VREF.

The memory unit 30 may execute the refresh operation according to the refresh signal SREF. The memory unit 30 may include a plurality of memory cells to store data therein. During the refresh operation, the data stored in the memory cells of the memory unit 30 may be sensed and amplified. In addition, the amplified data may be rewritten into the memory cells of the memory unit 30. The refresh operation may include an auto-refresh operation and a self-refresh operation.

Figure 2:
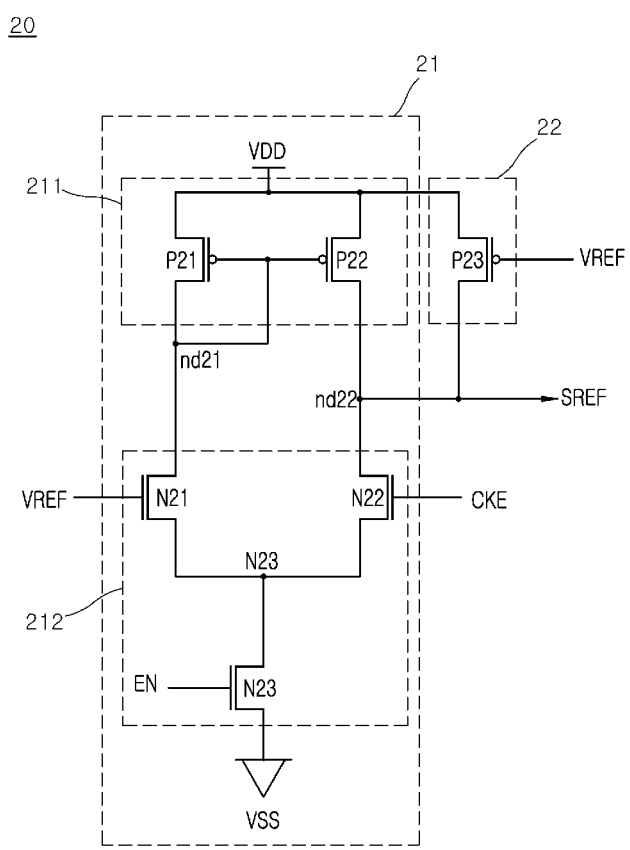
FIG. 2 is a circuit diagram illustrating an input buffer included in a semiconductor device of the semiconductor system shown in FIG. 1.

Referring to FIG. 2, the input buffer 20 may include a comparator 21 and a pull-up driver 22.

The comparator 21 may include a charge supplier 211 and a discharger 212.

The charge supplier 211 may include a PMOS transistor P21 electrically coupled between a power supply voltage VDD terminal and a node ND21. The charge supplier 211 may also include a PMOS transistor P22 electrically coupled between the power supply voltage VDD terminal and an output node ND22. Gates of the PMOS transistor P21 and the PMOS transistor P22 may be electrically coupled to the node ND21. More specifically, the charge supplier 211 may be electrically coupled between the power supply voltage VDD terminal and the nodes ND21 and ND22. Further, the PMOS transistors P21 and P22 of the charge supplier 211 may be turned on according to a voltage level of the node ND21 to supply electric charges from the power supply voltage VDD terminal to the nodes ND21 and ND22.

The discharger 212 may include an NMOS transistor N21 electrically coupled between the node ND21 and a node ND23, an NMOS transistor N22 electrically coupled between the output node ND22 and the node ND23, and an NMOS transistor N23 electrically coupled between the node ND23 and a ground voltage VSS terminal. The reference voltage signal VREF may be applied to a gate of the NMOS transistor N21. In addition, the external command signal CKE may be applied to a gate of the NMOS transistor N22. In addition, an enablement signal EN may be applied to a gate of the NMOS transistor N23. More specifically, the discharger 212 may be electrically coupled between the nodes ND21 and ND22 and the ground voltage VSS terminal and may receive the enablement signal EN to discharge electric charges of the nodes ND21 and ND22 into the ground voltage VSS terminal according to a level difference between the reference voltage signal VREF and the external command signal CKE. The enablement signal EN may be enabled to have a logic "high" level for operation of the comparator 21. The comparator 21 may be realized using a general differential amplifier circuit.

The pull-up driver 22 may be realized using a PMOS transistor P23 electrically coupled between the power supply voltage VDD terminal and the output node ND22. The reference voltage signal VREF may be applied to a gate of the PMOS transistor P23. In particular, the pull-up driver 22 may pull up a level of the output node ND22 with a first drivability or a second drivability according to a voltage level of the reference voltage signal VREF. The second drivability may be set to be greater than the first drivability. In addition, when the comparator 21 supplies electric charges to the output node N22 or discharges the electric charges of the output node N22, a drivability of the comparator 21 may be set to be greater than the first drivability of the pull-up driver 22.

More specifically, an example in which the pull-up driver 22 pulls up the output node N22 with the first drivability and an example in which the pull-up driver 22 pulls up the output node N22 with the second drivability will be described below.

First, the example in which the pull-up driver 22 pulls up the output node N22 with the first drivability according to a level of the reference voltage signal VREF will be described.

The PMOS transistor P23 of the pull-up driver 22 may be set to pull up the output node ND22 with the first drivability if the reference voltage signal VREF is generated. In particular, if the reference voltage signal VREF is generated to have a certain voltage level, a weak inversion channel may be formed between a source and a drain of the PMOS transistor P23 so that a relatively small current (corresponding to the first drivability) flows through the PMOS transistor P23.

Next, the example in which the pull-up driver 22 pulls up the output node N22 with the second drivability according to a level of the reference voltage signal VREF will be described.

The PMOS transistor P23 of the pull-up driver 22 may be set to pull up the output node ND22 with the second drivability if the reference voltage signal VREF is not generated. More specifically, if the reference voltage signal VREF is not generated to have a ground voltage VSS level or lower, a strong inversion channel may be formed between a source and a drain of the PMOS transistor P23 so that a relatively large current (corresponding to the second drivability) flows through the PMOS transistor P23.

Operations of the semiconductor system having the aforementioned configuration will be described hereinafter in conjunction with an example in which the reference voltage signal VREF is generated and an example in which the reference voltage signal VREF is not generated. In either case, it may be assumed that the external command signal CKE has a logic "low" level so that the semiconductor system operates in a refresh mode.

First, an operation of the semiconductor system will be described when the external command signal CKE has a logic "low" level and the reference voltage signal VREF is not generated.

The controller 1 may output the external command signal CKE having a logic "low" level.

The reference voltage generator 10 may not generate the reference voltage signal VREF. If the reference voltage signal VREF is not generated, a level of the reference voltage signal VREF may be set to be lower than a logic "low" level.

The discharger 212 of the comparator 21 may receive the reference voltage signal VREF and the external command signal CKE having a logic "low" level to reduce the amount of electric charges of the output node ND22. As a result, the amount of electric charges of the node ND21 may gradually increase. In such an instance, the charge supplier 211 may not supply electric charges to the output node ND22 because the amount of electric charges of the node ND21 increases.

The PMOS transistor P23 of the pull-up driver 22 may be turned on to pull up the output node ND22 with the second drivability because the reference voltage signal VREF is not generated.

In conclusion, the input buffer 20 may compulsively pull up the output node ND22 to generate the refresh signal SREF having a logic "high" level if the reference voltage signal VREF is not generated.

The memory unit 30 may receive the refresh signal SREF having a logic "high" level to execute the refresh operation.

Next, an operation of the semiconductor system will be described when the external command signal CKE has a logic "low" level and the reference voltage signal VREF is generated to have a certain constant level.

The controller 1 may output the external command signal CKE having a logic "low" level.

The reference voltage generator 10 may generate the reference voltage signal VREF having a certain constant level.

The discharger 212 of the comparator 21 may receive the reference voltage signal VREF and the external command signal CKE having a logic "low" level to reduce the amount of electric charges of the node ND21. As a result, the amount of electric charges of the output node ND22 may gradually increase. In such a case, the charge supplier 211 may not supply electric charges to the node ND21 because the amount of electric charges of the output node ND22 increases.

The PMOS transistor P23 of the pull-up driver 22 may be weakly turned on to pull up the output node ND22 with the first drivability because the reference voltage signal VREF is generated to have a certain constant level.

In conclusion, the input buffer 20 may pull up the output node ND22 with the drivability of the comparator 21 and the first drivability of the pull-up driver 22 to generate the refresh signal SREF having a logic "high" level. More specifically, the input buffer 20 may generate the refresh signal SREF whose level transition time is reduced.

The memory unit 30 may receive the refresh signal SREF having a logic "high" level to execute the refresh operation.

As described above, a semiconductor system according to an embodiment may compulsively drive an output signal of an input buffer to prevent an error of a refresh operation even though a reference voltage signal to determine a logic level of an input signal applied to the input buffer is not generated during the refresh operation. In addition, a drivability of the input buffer may be controlled according to a level of the reference voltage signal. Thus, a level transition time of an output signal of the input buffer may be reduced.

Figure 3:
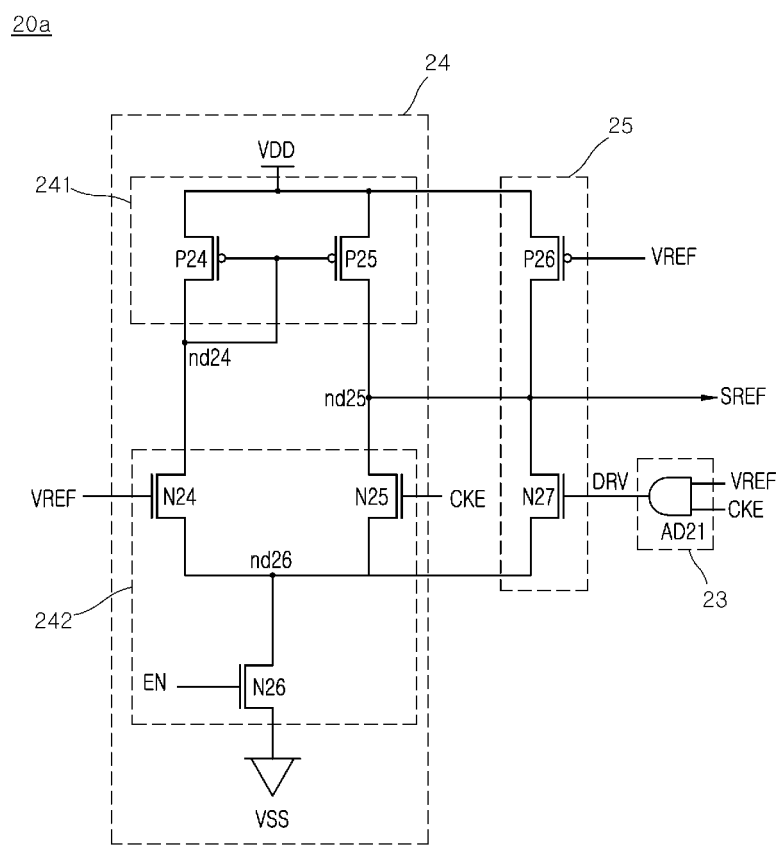
FIG. 3 is a circuit diagram illustrating another input buffer used instead of the input buffer shown in FIG. 2.

Referring to FIG. 3, a circuit diagram illustrating another input buffer 20a that can be used instead of the input buffer 20 shown in FIG. 2 is illustrated.

In FIG. 3, the input buffer 20a may include a logic unit 23, a comparator 24 and a driver 25.

The logic unit 23 may be realized using an AND gate AD21. The logic unit 23 may generate a drive signal DRV enabled to have a logic "high" level if the reference voltage signal VREF having a certain constant level and the external command signal CKE having a logic "high" level are inputted to AND gate AD21. Although FIG. 3 illustrates an example in which the logic unit 23 is realized using an AND gate, the invention is not limited thereto. More specifically, the logic unit 23 may be realized using any one of various circuit schemes.

The comparator 24 may include a charge supplier 241 and a discharger 242.

The charge supplier 241 may include a PMOS transistor P24 electrically coupled between the power supply voltage VDD terminal and a node ND24 and a PMOS transistor P25 electrically coupled between the power supply voltage VDD terminal and an output node ND25. Gates of the PMOS transistors P24 and P25 may be electrically coupled to the node ND24. More specifically, the charge supplier 241 may be electrically coupled between the power supply voltage VDD terminal and the nodes ND24 and ND25. Further, the PMOS transistors P24 and P25 of the charge supplier 241 may be turned on according to a voltage level of the node ND24 to supply electric charges from the power supply voltage VDD terminal to the nodes ND24 and ND25.

The discharger 242 may include an NMOS transistor N24 electrically coupled between the node ND24 and a node ND26. The discharger 242 may also include an NMOS transistor N25 electrically coupled between the output node ND25 and the node ND26. Further, the discharger 242 may include an NMOS transistor N26 electrically coupled between the node ND26 and the ground voltage VSS terminal. The reference voltage signal VREF may be applied to a gate of the NMOS transistor N24. In addition, the external command signal CKE may be applied to a gate of the NMOS transistor N25. Further, the enablement signal EN may be applied to a gate of the NMOS transistor N26. That is, the discharger 242 may be electrically coupled between the nodes ND24 and ND25 and the ground voltage VSS terminal and may receive the enablement signal EN to discharge electric charges of the nodes ND24 and ND25 into the ground voltage VSS terminal according to a level difference between the reference voltage signal VREF and the external command signal CKE. The enablement signal EN may be enabled to have a logic "high" level for operation of the comparator 24. The comparator 24 may be realized using a general differential amplifier circuit.

The driver 25 may be realized to include a first drive element P26 corresponding to a PMOS transistor electrically coupled between the power supply voltage VDD terminal and the output node ND25. The driver 25 may also include a second drive element N27 corresponding to an NMOS transistor electrically coupled between the output node ND25 and the node ND26. The reference voltage signal VREF may be applied to a gate of the PMOS transistor P26. In addition, the drive signal DRV may be applied to a gate of the NMOS transistor N27. More specifically, the driver 25 may pull up a level of the output node ND25 with a first drivability or a second drivability according to a voltage level of the reference voltage signal VREF or may pull down a level of the output node ND25 if the drive signal DRV is enabled. The second drivability may be set to be greater than the first drivability. Moreover, when the reference voltage signal VREF is generated to have a certain constant level, a drivability of the second drive element N27 may be set to be equal to or less than a drivability of the first drive element N26. In addition, when the comparator 24 supplies the electric charges to the output node N25 or discharges the electric charges of the output node N25, a drivability of the comparator 24 may be set to be greater than the first and second drivabilities of the driver 25 for pulling-up the output node ND25 as well as a drivability of the driver 25 for pulling-down the output node ND25.

More specifically, an example in which the driver 25 pulls up the output node N25 with the first drivability, an example in which the driver 25 pulls up the output node N25 with the second drivability, and an example in which the driver 25 pulls down the output node N25 will be described below.

First, the example in which the driver 25 pulls up the output node N25 with the first drivability according to a level of the reference voltage signal VREF will be described.

The first drive element P26 of the driver 25 may be set to pull up the output node ND25 with the first drivability if the reference voltage signal VREF is generated. In particular, if the reference voltage signal VREF is generated to have a certain voltage level, a weak inversion channel may be formed between a source and a drain of the first drive element P26 so that a relatively small current (corresponding to the first drivability) flows through the first drive element P26.

In such an instance, even though the drive signal DRV has a logic "high" level, the second drive element P27 may not pull down a level of the output node ND25 to the ground voltage VSS level because the comparator 24 supplies electric charges to the output node ND25 and the first drive element P26 pulls up the output node ND25 with the first drivability.

Next, the example in which the driver 25 pulls up the output node N25 with the second drivability according to a level of the reference voltage signal VREF will be described.

The first drive element P26 of the driver 25 may be set to pull up the output node ND25 with the second drivability if the reference voltage signal VREF is not generated. More specifically, if the reference voltage signal VREF is not generated to have a ground voltage VSS level or lower, a strong inversion channel may be formed between a source and a drain of the first drive element P26 so that a relatively large current (corresponding to the second drivability) flows through the first drive element P26.

In such a case, even though the drive signal DRV has a logic "high" level, the second drive element P27 may not pull down a level of the output node ND25 to the ground voltage VSS level because the first drive element P26 pulls up the output node ND25 with the second drivability.

Next, the example in which the driver 25 pulls down the output node N25 will be described below.

The first drive element P26 of the driver 25 may be set to pull up the output node ND25 with the first drivability if the reference voltage signal VREF is generated to have a certain constant level.

The second drive element P27 of the driver 25 may pull down the output node ND25 according to the drive signal DRV having a logic "high" level.

The input buffer 20a may pull down the output node ND25 with the drivability of the comparator 24 and the drivability of the driver 25 to generate the refresh signal SREF having a logic "low" level. More specifically, the input buffer 20a may generate the refresh signal SREF whose level transition time is reduced.

Operations of the semiconductor system including the input buffer 20a will be described in conjunction with an example in which the reference voltage signal VREF is generated and an example in which the reference voltage signal VREF is not generated. In either case, it may be assumed that the external command signal CKE has a logic "low" level so that the semiconductor system operates in a refresh mode. Moreover, operations of the semiconductor system including the input buffer 20a will be described in conjunction with an example in which the external command signal CKE has a logic "high" level so that the semiconductor system operates out of the refresh mode.

First, an operation of the semiconductor system will be described when the external command signal CKE has a logic "low" level and the reference voltage signal VREF is not generated to execute the refresh operation.

The controller 1 may output the external command signal CKE having a logic "low" level.

The reference voltage generator 10 may not generate the reference voltage signal VREF. If the reference voltage signal VREF is not generated, a level of the reference voltage signal VREF may be set to be lower than a logic "low" level.

The logic unit 23 may generate the drive signal DRV having a logic "low" level if the external command signal CKE has a logic "low" level and the reference voltage signal VREF is not generated.

The discharger 242 of the comparator 24 may receive the reference voltage signal VREF and the external command signal CKE having a logic "low" level to reduce the amount of electric charges of the output node ND25. Accordingly, the amount of electric charges of the node ND24 may gradually increase. In such a case, the charge supplier 241 may not supply electric charges to the output node ND25 because the amount of electric charges of the node ND24 increases.

The first drive element P26 of the driver 25 may be turned on to pull up the output node ND25 with the second drivability because the reference voltage signal VREF is not generated. The second drive element P27 of the driver 25 may be turned off according to the drive signal DRV having a logic "low" level to may not pull down the output node ND25.

In conclusion, the input buffer 20a may compulsively pull up the output node ND25 to generate the refresh signal SREF having a logic "high" level if the reference voltage signal VREF is not generated.

The memory unit 30 may receive the refresh signal SREF having a logic "high" level to execute the refresh operation.

Next, an operation of the semiconductor system will be described when the external command signal CKE has a logic "low" level and the reference voltage signal VREF is generated to execute the refresh operation.

The controller 1 may output the external command signal CKE having a logic "low" level.

The reference voltage generator 10 may generate the reference voltage signal VREF having a certain constant level.

The logic unit 23 may generate the drive signal DRV having a logic "low" level if the external command signal CKE has a logic "low" level and the reference voltage signal VREF is generated to have a certain constant level.

The discharger 242 of the comparator 24 may receive the reference voltage signal VREF having a certain constant level and the external command signal CKE having a logic "low" level to reduce the amount of electric charges of the node ND24. As a result, the amount of electric charges of the output node ND25 may gradually increase. In such an instance, the charge supplier 241 may supply electric charges to the output node ND25 because the amount of electric charges of the node ND24 is reduced.

The first drive element P26 of the driver 25 may be weakly turned on to pull up the output node ND25 with the first drivability because the reference voltage signal VREF is generated to have a certain constant level. The second drive element P27 of the driver 25 may be turned off according to the drive signal DRV having a logic "low" level not to pull down the output node ND25.

In conclusion, the input buffer 20a may pull up the output node ND25 with the drivability of the comparator 24 and the first drivability of the driver 25 to generate the refresh signal SREF having a logic "high" level. More specifically, the input buffer 20a may generate the refresh signal SREF whose level transition time is reduced.

The memory unit 30 may receive the refresh signal SREF having a logic "high" level to execute the refresh operation.

Next, operations of the semiconductor system including the input buffer 20a will be described in conjunction with an example in which the external command signal CKE has a logic "high" level so that the semiconductor system operates out of the refresh mode.

The controller 1 may output the external command signal CKE having a logic "high" level.

The reference voltage generator 10 may generate the reference voltage signal VREF having a certain constant level.

The logic unit 23 may generate the drive signal DRV having a logic "high" level according to the reference voltage signal VREF having a certain constant level and the external command signal CKE has a logic "high" level.

The discharger 242 of the comparator 24 may receive the reference voltage signal VREF having a certain constant level and the external command signal CKE having a logic "high" level to reduce the amount of electric charges of the output node ND25. Accordingly, the amount of electric charges of the node ND24 may gradually increase. In such an instance, the charge supplier 241 may not supply electric charges to the output node ND25 because the amount of electric charges of the node ND24 increases.

The first drive element P26 of the driver 25 may be weakly turned on to pull up the output node ND25 with the first drivability because the reference voltage signal VREF is generated to have a certain constant level. The second drive element P27 of the driver 25 may be turned on according to the drive signal DRV having a logic "high" level to pull down the output node ND25.

In conclusion, the input buffer 20a may pull down the output node ND25 with the drivability of the comparator 24 and the drivability of the driver 25 to generate the refresh signal SREF having a logic "low" level. More specifically, the input buffer 20a may generate the refresh signal SREF whose level transition time is reduced.

The memory unit 30 may receive the refresh signal SREF having a logic "low" level to terminate the refresh operation.

As described above, a semiconductor system according to the above embodiment may compulsively drive an output signal of an input buffer to prevent an error of a refresh operation even though a reference voltage signal to determine a logic level of an input signal applied to the input buffer is not generated during the refresh operation. In addition, a drivability of the input buffer may be controlled according to a level of the reference voltage signal. Thus, a level transition time of an output signal of the input buffer may be reduced.

What is claimed is:

1. A semiconductor system comprising:
   a controller suitable for outputting an external command signal; and
   a semiconductor device suitable for comparing the external command signal with a reference voltage signal to generate a refresh signal and for executing a refresh operation according to the refresh signal,
   wherein the refresh signal is enabled if the reference voltage signal is not generated.

2. The semiconductor system of claim 1, wherein the reference voltage signal is not generated during the refresh operation.

3. The semiconductor system of claim 1, wherein the refresh signal is enabled if a level of the external command signal is lower than a level of the reference voltage signal.

4. The semiconductor system of claim 1, wherein the semiconductor device includes:
   a reference voltage generator suitable for generating the reference voltage signal with a constant level;
   an input buffer suitable for comparing the external command signal with the reference voltage signal to generate the refresh signal, a drivability of the input buffer for the refresh signal being controlled according to a level of the reference voltage signal; and
   a memory unit suitable for executing the refresh operation according to the refresh signal.

5. The semiconductor system of claim 4, wherein the input buffer includes:
   a comparator suitable for driving an output node in response to the external command signal, the reference voltage signal and an enablement signal to generate the refresh signal through the output node; and
   a pull-up driver suitable for pulling up the output node with a first drivability or a second drivability according to a level of the reference voltage signal,
   wherein the second drivability of the pull-up driver is greater than the first drivability of the pull-up driver.

6. The semiconductor system of claim 5,
   wherein the pull-up driver pulls up the output node with the first drivability if the reference voltage signal is generated; and
   wherein the pull-up driver pulls up the output node with the second drivability if the reference voltage signal is not generated.

7. The semiconductor system of claim 5, wherein the comparator includes:
   a charge supplier electrically coupled between a power supply voltage terminal and a first node as well as between the power supply voltage terminal and the output node, the charge supplier being suitable for supplying electric charges from the power supply voltage terminal to the first node and the output node according to a level of the first node; and
   a discharger electrically coupled between the first node and a ground voltage terminal as well as between the output node and the ground voltage terminal, the discharger being suitable for receiving the enablement signal to discharge electric charges of the first node and the output node into the ground voltage terminal according to a level difference between the reference voltage signal and the external command signal.

8. The semiconductor system of claim 4, wherein the input buffer includes:
   a logic unit suitable for generating a drive signal enabled in response to the external command signal if the reference voltage signal is generated;
   a comparator suitable for driving an output node thereof in response to the external command signal, the reference voltage signal and an enablement signal to generate the refresh signal through the output node; and
   a driver suitable for pulling up the output node with a first drivability or a second drivability according to a level of the reference voltage signal or suitable for pulling down the output node in response to the drive signal.

9. The semiconductor system of claim 8, wherein the comparator includes:
   a charge supplier electrically coupled between a power supply voltage terminal and a first node as well as between the power supply voltage terminal and the output node, the charge supplier being suitable for supplying electric charges from the power supply voltage terminal to the first node and the output node; and
   a discharger electrically coupled between the first node and a ground voltage terminal as well as between the output node and the ground voltage terminal, the discharger being suitable for receiving the enablement signal to discharge electric charges of the first node and the output node into the ground voltage terminal according to a level difference between the reference voltage signal and the external command signal.

10. The semiconductor system of claim 8, wherein the driver includes:
    a first drive element suitable for pulling up the output node with the first drivability or the second drivability according to a level of the reference voltage signal; and
    a second drive element suitable for pulling down the output node according to the drive signal.

11. A semiconductor device comprising:
    a reference voltage generator suitable for generating a reference voltage signal with a constant level;
    an input buffer suitable for comparing an external command signal with the reference voltage signal to generate a refresh signal, the input buffer driving the refresh signal with a drivability controlled according to a level of the reference voltage signal; and
    a memory unit suitable for executing a refresh operation according to the refresh signal.

12. The semiconductor device of claim 11, wherein the refresh signal is enabled if a level of the external command signal is lower than a level of the reference voltage signal.

13. The semiconductor device of claim 11, wherein the input buffer includes:
    a comparator suitable for driving an output node according to the external command signal, the reference voltage signal and an enablement signal to generate the refresh signal through the output node; and
    a pull-up driver suitable for pulling up the output node with a first drivability or a second drivability according to a level of the reference voltage signal,
    wherein the second drivability of the pull-up driver is greater than the first drivability of the pull-up driver.

14. The semiconductor device of claim 13,
wherein the pull-up driver pulls up the output node with the first drivability if the reference voltage signal is generated; and
wherein the pull-up driver pulls up the output node with the second drivability if the reference voltage signal is not generated.

15. The semiconductor device of claim 13, wherein the comparator includes:
a charge supplier electrically coupled between a power supply voltage terminal and a first node as well as between the power supply voltage terminal and the output node, the charge supplier being suitable for supplying electric charges from the power supply voltage terminal to the first node and the output node according to a level of the first node; and
a discharger electrically coupled between the first node and a ground voltage terminal as well as between the output node and the ground voltage terminal, the discharger being suitable for receiving the enablement signal to discharge electric charges of the first node and the output node into the ground voltage terminal according to a level difference between the reference voltage signal and the external command signal.

16. The semiconductor device of claim 11, wherein the input buffer includes:
a logic unit suitable for generating a drive signal enabled in response to the external command signal if the reference voltage signal is generated;
a comparator suitable for driving an output node thereof according to the external command signal, the reference voltage signal and an enablement signal to generate the refresh signal through the output node; and
a driver suitable for pulling up the output node with a first drivability or a second drivability according to a level of the reference voltage signal or suitable for pulling down the output node according to the drive signal.

17. The semiconductor device of claim 16, wherein the comparator includes:
a charge supplier electrically coupled between a power supply voltage terminal and a first node as well as between the power supply voltage terminal and the output node, the charge supplier being suitable for supplying electric charges from the power supply voltage terminal to the first node and the output node; and
a discharger electrically coupled between the first node and a ground voltage terminal as well as between the output node and the ground voltage terminal, the discharger being suitable for receiving the enablement signal to discharge electric charges of the first node and the output node into the ground voltage terminal according to a level difference between the reference voltage signal and the external command signal.

18. The semiconductor device of claim 16, wherein the driver includes:
a first drive element suitable for pulling up the output node with the first drivability or the second drivability according to a level of the reference voltage signal; and
a second drive element suitable for pulling down the output node according to the drive signal.

19. An input buffer comprising:
a comparator suitable for comparing an external command signal with a reference voltage signal and for driving an output node according to a comparison result of the external command signal and the reference voltage signal to generate a refresh signal through the output node; and
a pull-up driver suitable for pulling up the output node with a first drivability or a second drivability according to a level of the reference voltage signal.

20. The input buffer of claim 19,
wherein the pull-up driver pulls up the output node with the first drivability if the reference voltage signal is generated;
wherein the pull-up driver pulls up the output node with the second drivability if the reference voltage signal is not generated; and
wherein the second drivability is greater than the first drivability.

21. The input buffer of claim 19, wherein the comparator is configured to receive the reference voltage signal and the external command signal to reduce electric charges for an internal node.

22. The input buffer of claim 19, wherein electric charges for the output node are configured to increase.

23. The input buffer of claim 19, wherein the reference voltage signal is generated to be at a constant level.

24. The input buffer of claim 19, wherein the output node is configured to be pulled up with a drivability of the comparator.

25. The input buffer of claim 24, wherein the output node is configured to be pulled up with an other drivability of the pull-up driver.

* * * * *